United States Patent
Wang et al.

(10) Patent No.: US 12,329,995 B2
(45) Date of Patent: Jun. 17, 2025

(54) METHOD FOR PREVENTING FALL OF OPERATOR, CONTROLLER, SAFETY BELT AND STORAGE MEDIUM

(71) Applicant: Yunnan Power Grid Co., Ltd. Electric Power Research Institute, Kunming (CN)

(72) Inventors: Ke Wang, Kunming (CN); Enxin Xiang, Kunming (CN); Jing Peng, Kunming (CN); Hao Yang, Kunming (CN); Xianping Zhao, Kunming (CN); Xiangyu Tan, Kunming (CN); Mingxian Liu, Kunming (CN)

(*) Notice: Subject to any disclaimer, the term of this patent is extended or adjusted under 35 U.S.C. 154(b) by 0 days.

(21) Appl. No.: 18/738,915

(22) Filed: Jun. 10, 2024

(65) Prior Publication Data
US 2024/0325798 A1    Oct. 3, 2024

Related U.S. Application Data

(63) Continuation of application No. PCT/CN2023/107649, filed on Jul. 17, 2023.

(30) Foreign Application Priority Data

Aug. 23, 2022 (CN) .......................... 202211011333.5

(51) Int. Cl.
*A62B 35/00* (2006.01)
*G01R 33/00* (2006.01)
(Continued)

(52) U.S. Cl.
CPC ...... *A62B 35/0025* (2013.01); *A62B 35/0018* (2013.01); *G01R 33/0023* (2013.01);
(Continued)

(58) Field of Classification Search
CPC ............ A62B 35/0025; A62B 35/0018; A62B 35/0056; A62B 35/0006; G08B 21/02;
(Continued)

(56) References Cited

U.S. PATENT DOCUMENTS

| 10,043,368 B1 | 8/2018 | Fonzi, III et al. |
| 2014/0266169 A1* | 9/2014 | Huntley ................. G01N 27/90 385/100 |

(Continued)

FOREIGN PATENT DOCUMENTS

| CN | 105035067 A | 11/2015 |
| CN | 106730476 A | 5/2017 |

(Continued)

OTHER PUBLICATIONS

JP2018130134A_Description_20240821_1926_translation.pdf (Year: 2018).*

(Continued)

*Primary Examiner* — Omar F Hijaz

(57) ABSTRACT

The present application discloses a method for preventing a fall of an operator, a controller, a safety belt and a computer-readable storage medium. The method for preventing a fall of an operator includes obtaining magnetic field information of the safety belt body worn by the operator, querying a preset fixed state mapping table based on the magnetic field information of the safety belt body to obtain a fixed state of the safety belt, the fixed state mapping table is configured to save a mapping relationship between the magnetic field information and the fixed state; and outputting a warning signal based the fixed state.

8 Claims, 7 Drawing Sheets

(51) Int. Cl.
   *G08B 21/02* (2006.01)
   *G08B 21/04* (2006.01)
(52) U.S. Cl.
   CPC .......... *G08B 21/02* (2013.01); *A62B 35/0006* (2013.01); *A62B 35/0056* (2013.01); *G08B 21/0446* (2013.01)
(58) Field of Classification Search
   CPC ... G08B 21/0446; B66F 17/006; G01R 33/02; G01N 27/83
   See application file for complete search history.

(56)         References Cited

U.S. PATENT DOCUMENTS

| 2017/0162024 | A1 | 6/2017 | Pham et al. |
| 2018/0245313 | A1 | 8/2018 | Shibamori et al. |
| 2020/0166585 | A1* | 5/2020 | Miyazaki ............. G01R 33/093 |
| 2020/0222732 | A1* | 7/2020 | Rutkowski ............. G08B 21/02 |

FOREIGN PATENT DOCUMENTS

| CN | 106999736 | A |   | 8/2017 |   |
| CN | 207667012 | U |   | 7/2018 |   |
| CN | 110494191 | A |   | 11/2019 |   |
| CN | 211158257 | U |   | 8/2020 |   |
| CN | 211751926 | U |   | 10/2020 |   |
| CN | 111888686 | A |   | 11/2020 |   |
| CN | 111956965 | A |   | 11/2020 |   |
| CN | 113519016 | A |   | 10/2021 |   |
| CN | 113995976 | A |   | 2/2022 |   |
| CN | 114217361 | A |   | 3/2022 |   |
| EP | 3443547 | A1 |   | 2/2019 |   |
| JP | 2014004005 | A |   | 1/2014 |   |
| JP | 2016198235 | U |   | 12/2016 |   |
| JP | 2018130134 | A | * | 8/2018 | ............. A62B 35/00 |
| JP | 2021052920 | A | * | 4/2021 | ............. A62B 35/00 |
| KR | 20170002992 | U |   | 8/2017 |   |
| KR | 20210036176 | A |   | 4/2021 |   |
| KR | 20210101767 | A |   | 8/2021 |   |
| RU | 210740 | U1 |   | 4/2022 |   |
| WO | 2017141500 | A1 |   | 8/2017 |   |
| WO | 2018178780 | A2 |   | 10/2018 |   |
| WO | 2021210374 | A1 |   | 10/2021 |   |

OTHER PUBLICATIONS

JP2021052920A_Description_20240823_1930_translation.pdf (Year: 2021).*
Internation Search Report of PCT/CN2023/107649, Mailed Oct. 26, 2023.

* cited by examiner

METHOD FOR PREVENTING FALL OF OPERATOR, CONTROLLER, SAFETY BELT AND STORAGE MEDIUM

CROSS-REFERENCE TO RELATED APPLICATIONS

The present application claims priority to Chinese Patent Application No. 202211011333.5, filed Aug. 23, 2022, the entire disclosure of which is incorporated herein by reference.

TECHNICAL FIELD

The present application belongs to the technical field of safe work at height, and particularly to a method of preventing a fall of an operator, a controller, a safety belt and a computer-readable storage medium.

BACKGROUND

Safety belts are technical measures for the safety protection of the operator at height. When working at height, the operator needs to wear the safety belt correctly, in order to avoid the operator losing the protection and falling down. Safety belts are usually configured with safety ropes, surrounding-rod belts and hooks, for preventing high falls by suspending and hanging when working at a fixed point or working movingly at height.

However, the working at height is usually heavy, and the operators do not strictly follow the operational requirements when climbing or moving at height, and forget to hang and check due to poor operational habits, which leads to an increased risk of accidents. How to improve the safety of operators is the urgent need of the current production safety technology.

The preceding description is intended to provide general background information and does not necessarily constitute related art.

SUMMARY

Based on above, it is necessary to solve the above problem by proposing a method for preventing a fall of an operator, a controller, a safety belt and a computer-readable storage medium.

The present application solves the technical problem by adopting the following technical solutions:

The present application provides a method for preventing a fall of an operator, applied to a safety belt, the method includes: obtaining magnetic field information of the safety belt body worn by the operator; querying a preset fixed state mapping table based on the magnetic field information of the safety belt body to obtain a fixed state of the safety belt, the fixed state mapping table is configured to save a mapping relationship between the magnetic field information of the safety belt and the fixed state; and outputting a warning signal based the fixed state.

In an embodiment, the magnetic field information of the safety belt body includes a first surrounding-rod ring magnetic field information, a second surrounding-rod ring magnetic field information, a first surrounding-rod belt hook magnetic field information, a second surrounding-rod belt hook magnetic field information, a third surrounding-rod belt hook magnetic field information, a fourth surrounding-rod belt hook magnetic field information, a first safety rope hook magnetic field information, a second safety rope hook magnetic field information, a third safety rope hook magnetic field information, and a fourth safety rope hook magnetic field information; the first surrounding-rod ring magnetic field information is magnetic field information when the surrounding-rod belt body is not wrapped around a fixture; the second the surrounding-rod ring magnetic field information is magnetic field information when the surrounding-rod belt body is wrapped around the fixture; the first surrounding-rod belt hook magnetic field information is magnetic field information when the surrounding-rod belt hook is in an empty ring state; the second surrounding-rod belt hook magnetic field information is magnetic field information when the surrounding-rod belt hook is buckled to a waist D-ring; the third surrounding-rod belt hook magnetic field information is magnetic field information when the surrounding-rod belt hook is buckled to the surrounding-rod belt body; the fourth surrounding-rod belt hook magnetic field information is magnetic field information when the surrounding-rod belt hook suspends the fixture; and the first safety rope hook magnetic field information is magnetic field information when the safety rope hook is in the empty ring state; the second safety rope hook magnetic field information is magnetic field information when the safety rope hook is buckled to the waist D-ring; the third safety rope hook magnetic field information is magnetic field information when the safety rope hook is buckled to the safety rope body; and the fourth safety rope hook magnetic field information is magnetic field information when the safety rope hook suspends the fixture.

In an embodiment, the querying the preset fixed state mapping table based on the magnetic field information of the safety belt body to obtain the fixed state of the safety belt includes: when the magnetic field information of the safety belt body is any one of the first surrounding-rod ring magnetic field information, the first surrounding-rod belt hook magnetic field information, the second surrounding-rod belt hook magnetic field information, the first safety rope hook magnetic field information, and the second safety rope hook magnetic field information, determining the safety belt to be in an unfixed state based on the fixed state mapping table; when the magnetic field information of the safety belt body is any one of the second surrounding-rod ring magnetic field information, the third surrounding-rod belt hook magnetic field information, the fourth surrounding-rod belt hook magnetic field information, the third safety rope hook magnetic field information, and the fourth safety rope hook magnetic field information, determining the safety belt to be in the fixed state based on the fixed state mapping table.

In an embodiment, the warning signal includes one of an alarm signal and an alert signal; the outputting the warning signal based on the fixed state includes: outputting the alarm signal when the safety belt is determined to be in the unfixed state; or outputting the alert signal when the safety belt is determined to be in the fixed state.

In an embodiment, the outputting the warning signal includes: outputting a first warning instruction to an acoustic and optical alarm unit for outputting an acoustic and optical alarm based on the first warning instruction; and sending a second warning instruction to a remote communication unit for controlling the remote communication unit to output monitoring warning information to a remote backend based on the second warning instruction.

The present application also provides a controller, which includes: a processor and a memory; the processor is configured to execute a computer program stored in the memory to implement the method as mentioned above.

The present application also provides a safety belt, which includes: a safety belt body, wherein the safety belt body includes a waist belt, a surrounding-rod belt and a safety rope; a controller as mentioned above; a magnetic field sensing device, configured for detecting and sending magnetic field information of the safety belt body to the controller; and an early warning device, configured for responding to a control of the controller to output a warning signal.

In an embodiment, the surrounding-rod belt includes a surrounding-rod belt hook and a surrounding-rod belt body, and the safety rope includes a safety rope hook and a safety rope body; the safety belt body includes a power supply and a wire, and the surrounding-rod belt body, the surrounding-rod belt hook and the safety rope hook, when powered by the power supply, form a closed loop through the wire; a surface of the surrounding-rod belt body is coated with a magnetically conductive material, and when the surrounding-rod belt hook is buckled to the surrounding-rod belt body and the safety rope hook is buckled to the safety rope body, the surrounding-rod belt body, the surrounding-rod belt hook and the safety rope hook form a closed magnetic loop through the magnetically conductive material; the closed loop and the closed magnetic loop form an alternating magnetic field to be detachable by the magnetic field sensing device.

In an embodiment, the early warning device includes: an acoustic and optical alarm unit, configured for responding to a first warning instruction received from the controller to output an acoustic and optical alarm signal; and a remote communication unit, configured for responding to a second warning instruction received from the controller to output monitoring warning information to a remote backend.

The present application also provides a computer-readable storage medium, on which a computer program is stored, wherein the computer program when executed by a processor implements a method as mentioned above.

The use of embodiments of the present application has the following beneficial effects:

The present application can determine, on the basis of not changing the mechanical structure and safety performance of an existing safety belt, the fixed state information of the safety belt through the magnetic field information of the safety belt, and provide a warning timely when the safety belt is in the unfixed state, so as to improve the operational safety of the operator.

The above description is only an overview of the technical solution of the present application, in order to be able to more clearly understand the technical means of the present application, which may be implemented based on the contents of the specification, and in order to make the above and other purposes, features and advantages of the present application more obvious and easy to understand, the following better embodiments are cited in particular and cooperated with the accompanying drawings for detail description. It should be understood that the above general description and the later detailed description are only exemplary and explanatory, and do not limit the present application.

BRIEF DESCRIPTION OF THE DRAWINGS

In order to more clearly illustrate the technical solutions in the embodiments or related art of the present application, the accompanying drawings to be used in the description of the embodiments or related art will be briefly introduced below, and it will be obvious that the accompanying drawings in the following description are only some of the embodiments of the present application, and that for those skilled in the field, other accompanying drawings can be obtained based on these drawings without any creative labour.

DETAILED DESCRIPTION OF THE EMBODIMENTS

The technical solutions in the embodiments of the present application will be described clearly and completely in the following in conjunction with the accompanying drawings in the embodiments of the present application, and it is obvious that the described embodiments are only a part of the embodiments of the present application and not all of the embodiments. Based on the embodiments in the present application, all other embodiments obtained by those skilled in the art without any creative labour fall within the scope of the present application.

Figure 1:
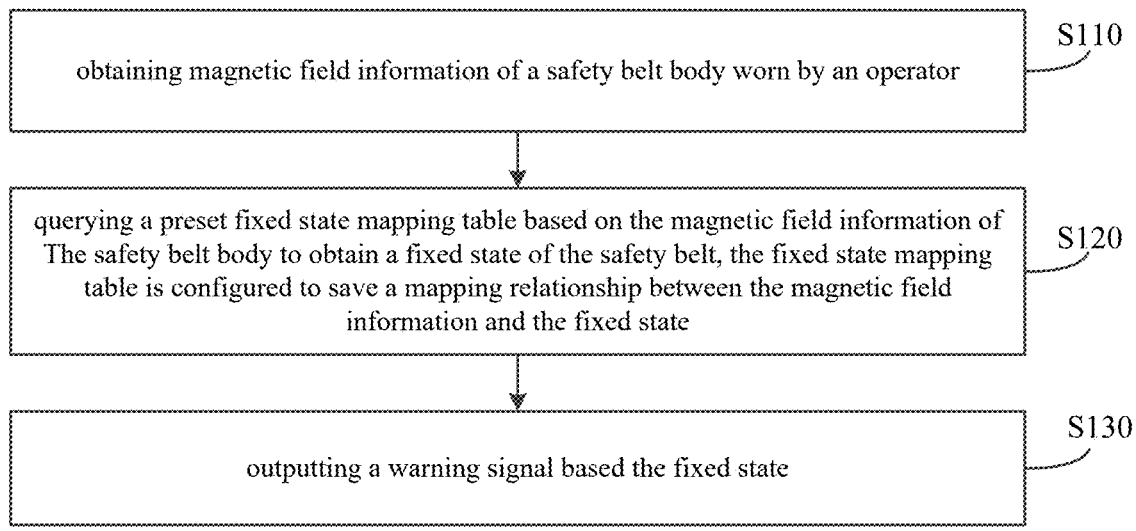
FIG. 1 is a flowchart of a method for preventing a fall of an operator in an embodiment.

The safety belt is a technical measure for the safety protection of the operator at height, please refer to FIG. 2 and FIGS. 11 and 12 and FIGS. 13 and 14, the safety belt body A100 is usually configured with a surrounding-rod belt 110, a safety rope 120, and a waist belt 130, for preventing high falls by suspending and hanging when working at a fixed point or working movingly at height, and realizing the whole process of protection by switching alternately between the safety rope hook 121 and the surrounding-rod belt hook 111 during moving. However, the working at height is usually heavy, and the operators do not strictly follow the operational requirements when climbing or moving at height, and forget to hang and check due to poor operational habits, which leads to an increased risk of accidents. For how to give a warning timely through an active detection and an automatic monitoring, a method for preventing a fall of an operator provided by an embodiment of the present application is proposed, which includes steps S110 and S120, and the specific implementation process can refer to FIG. 1, which is a flowchart of the method for preventing a fall of an operator in an embodiment.

Step S110: obtaining magnetic field information of the safety belt body worn by an operator.

Figure 2:
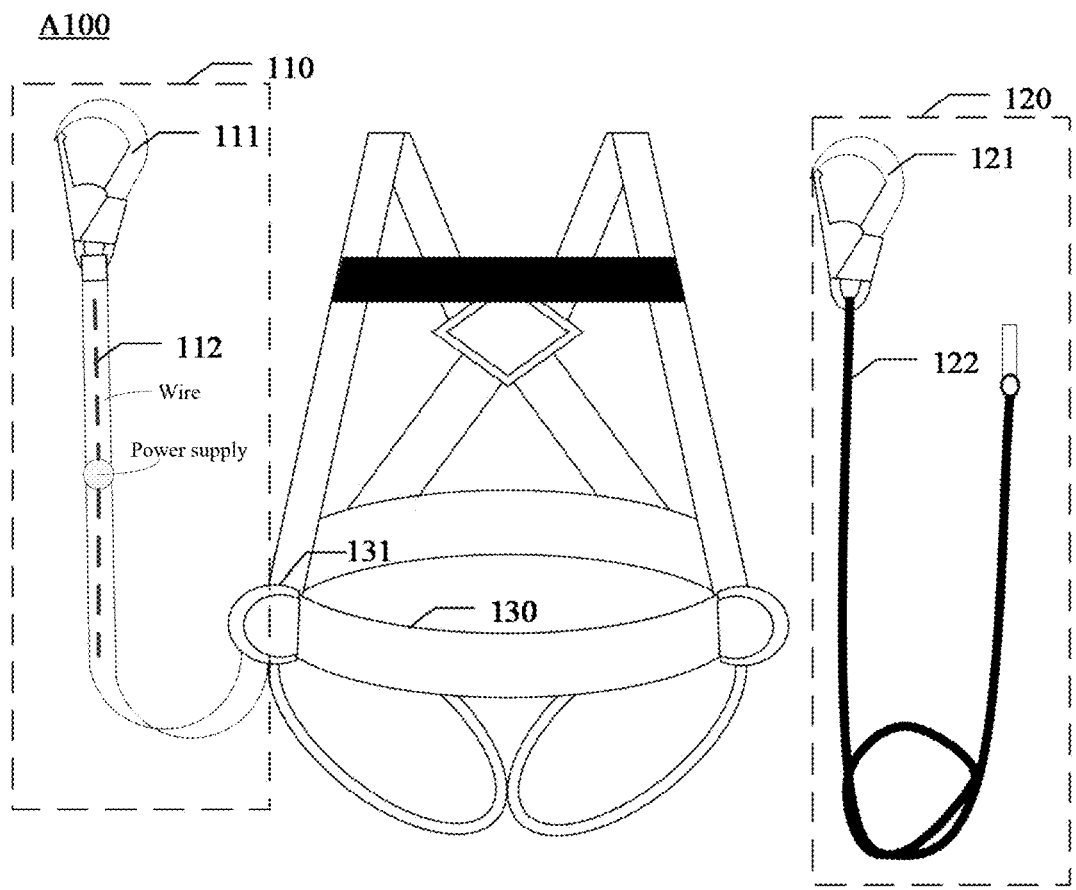
FIG. 2 is a schematic structural diagram of a safety belt body in an embodiment.

In one embodiment, please continue to refer to FIG. 2, the safety belt body A100 further includes a waist belt 130 and a waist D-ring 131. The surrounding-rod belt 110 further includes a surrounding-rod belt body 112 and a surrounding-rod belt hook 111. The safety rope 120 further includes a safety rope hook 121 and a safety rope body 122. In order to make the fixed state of the safety belt to be detected without changing the existing mechanical structure and safety performance of the safety belt, a surface of each component of the safety belt A100 in the present application is coated with a magnetically conductive material, which may include, but is not limited to, magnetically conductive paint, viscous magnetically conductive tape, viscous magnetically conductive powder, etc. Thus, a stable closed magnetic loop is formed when the surrounding-rod belt hook 111 is buckled to the surrounding-rod belt body 112, and the safety rope hook 121 is buckled to the safety rope body 122, etc. And a power supply and a wire (both are not shown in drawings) may be provided within the safety belt. When the power supply is turned on, the corresponding component can form a closed loop through the wire provided inside. The closed loop and the closed magnetic loop can form an alternating magnetic field to change the strength of the original magnetic field, which can be detected by the corresponding magnetic field sensing device and then further generated to be the corresponding magnetic field information. The closed loop, the closed magnetic loop, and the magnetic field information, etc. for each component will be expanded in detail later, and will not be described in detail here.

In one embodiment, the magnetic field information includes a first surrounding-rod ring magnetic field information, a second surrounding-rod ring magnetic field information, a first surrounding-rod belt hook magnetic field information, a second surrounding-rod belt hook magnetic field information, a third surrounding-rod belt hook magnetic field information, a fourth surrounding-rod belt hook magnetic field information, a first safety rope hook magnetic field information, a second safety rope hook magnetic field information, a third safety rope hook magnetic field information, and a fourth safety rope hook magnetic field information. The first surrounding-rod ring magnetic field information is magnetic field information when the surrounding-rod belt body 112 is not wrapped around a fixture 20; the second surrounding-rod ring magnetic field information is magnetic field information when the surrounding-rod belt body 112 is wrapped around the fixture (e.g. telegraph pole); the first surrounding-rod belt hook magnetic field information is magnetic field information when the surrounding-rod belt hook 111 is in an empty ring state; the second surrounding-rod belt hook magnetic field information is magnetic field information when the surrounding-rod belt hook 111 is buckled to a waist D-ring 131; the third surrounding-rod belt hook magnetic field information is magnetic field information when the surrounding-rod belt hook 111 is buckled to the surrounding-rod belt body 112; the fourth surrounding-rod belt hook magnetic field information is magnetic field information when the surrounding-rod belt hook 111 suspends the fixture; and the first safety rope hook magnetic field information is magnetic field information when the safety rope hook 121 is in the empty ring state; the second safety rope hook magnetic field information is magnetic field information when the safety rope hook 121 is buckled to the waist D-ring 131; the third safety rope hook magnetic field information is magnetic field information when the safety rope hook 121 is buckled to the safety rope body 122; and the fourth safety rope hook magnetic field information is magnetic field information when the safety rope hook 121 suspends the fixture.

Figure 3:
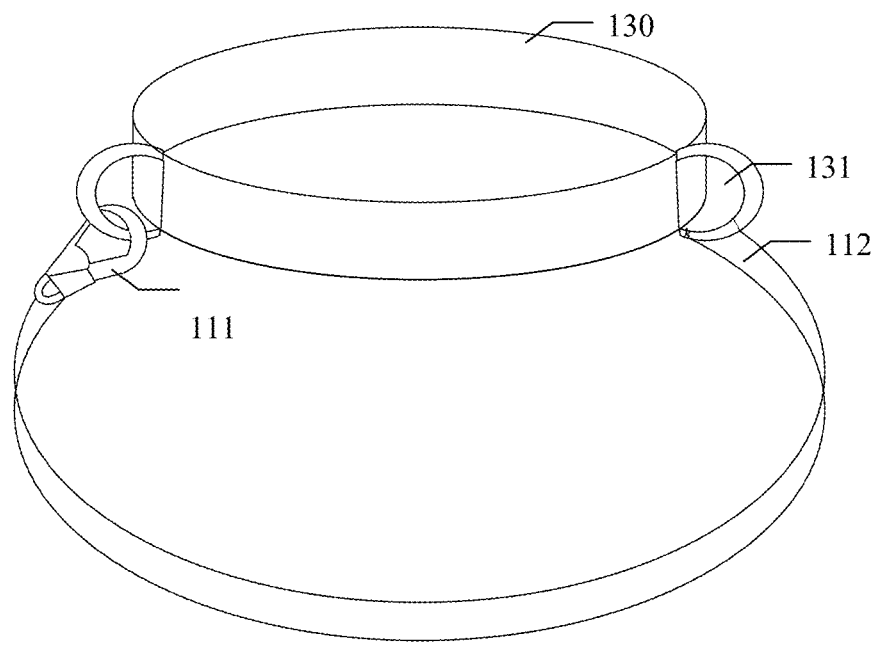
FIG. 3 is a schematic diagram of a surrounding-rod ring in an embodiment.
Figure 4:
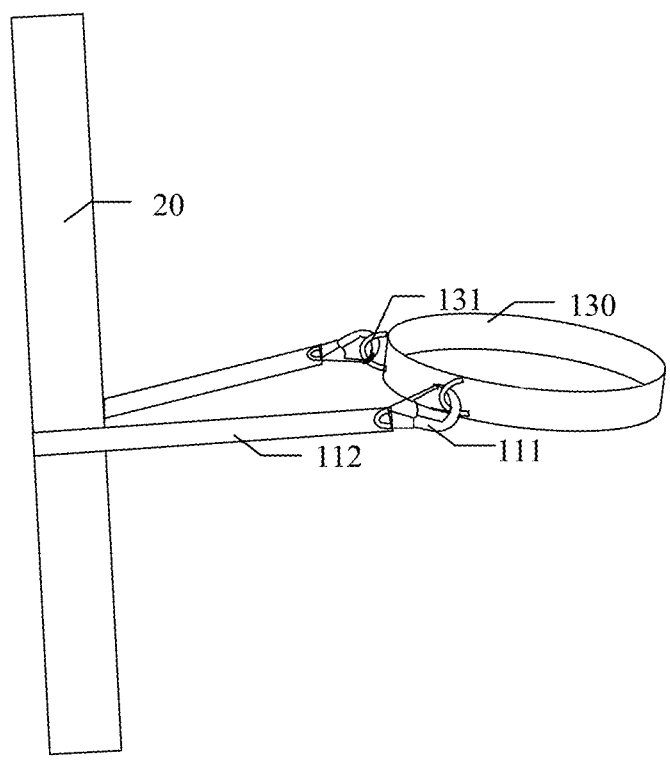
FIG. 4 is a schematic diagram of a surrounding-rod belt encircling a fixture in an embodiment.

In one embodiment, the surrounding-rod ring can refer to FIGS. 3 and 4. Taking FIG. 3 as an example, FIG. 3 is a schematic diagram of the surrounding-rod ring, one end of the surrounding-rod belt body 112 is fixed to a waist D-ring 131, and another end of the surrounding-rod belt body 112 is fixed to the surrounding-rod belt hook 111. When the surrounding-rod belt hook 111 is connected the hook of another waist D-ring 131, a surrounding-rod ring including the waist belt 130, the surrounding-rod belt body 112, and the surrounding-rod belt hook 111 is formed. As previously described, the surfaces of the surrounding-rod belt 110 and the waist belt 130 are coated with magnetically conductive material, thereby forming a closed magnetic loop; and the surrounding-rod belt 110 and the waist belt 130 are provided with wires inside, the surrounding-rod belt hook and the safety rope hook when powered by the power supply form a closed loop. The type of the current source may include, but is not limited to, an inter-frequency, pulsed current source, without any specific limitation. The closed magnetic loop and the closed loop within the surrounding-rod ring form an alternating magnetic field, the magnetic field information of which can be captured by the magnetic field sensing device. When the surrounding-rod ring shown in FIG. 3 is in an empty ring state, the surrounding-rod belt 110 and the waist belt 130 are provided with attached wires, and the current source within the surrounding-rod belt hook 111 forms a closed hoop including the waist belt 130, the surrounding-rod belt body 112 and the surrounding-rod hook 111 through the attached wires and the buckle type hook, and an alternating magnetic field is formed within the enclosed surrounding-rod ring. The strength of the magnetic field is set to the reference value A3 when the surrounding-rod ring does not encircle the fixture 20, that is, the magnetic field information of the surrounding-rod belt 110 obtained at this time is the first surrounding-rod ring magnetic field information. In addition, referring to FIG. 4, FIG. 4 is a schematic diagram of the surrounding-rod belt 110 surrounding the fixture 20, the fixture 20 may specifically be an electric pole, a post, a casing, etc., which is usually a metal structure. It can therefore be understood that since there is the metal fixture 20 in the magnetic loop, thus it results in a change in the magnetic field inside the surrounding-rod ring, and thus when the surrounding-rod belt band 112 surrounds the fixture 20, the magnetic field information is noted as the second surrounding-rod ring magnetic field information, which can be represented by the strength of the magnetic field of D3.

Figure 5:
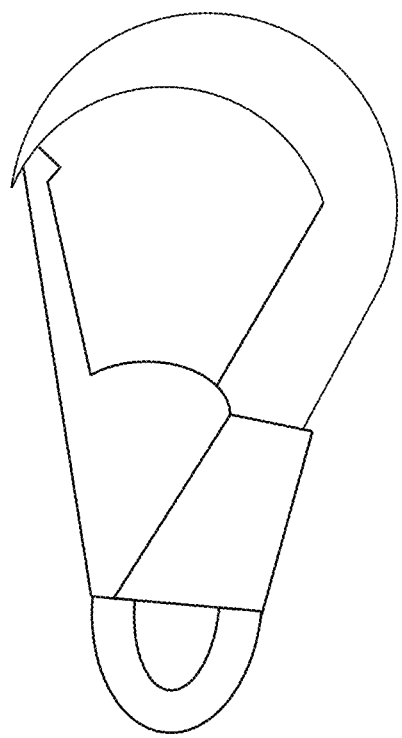
FIG. 5 is a schematic diagram of a surrounding-rod belt hook or a safety rope hook in an embodiment.

Further, the safety rope hook 121 and the surrounding-rod belt hook 111 have the same structures, and are therefore presented together, as illustrated in FIG. 5, FIG. 5 is a schematic diagram of the surrounding-rod belt hook 111 or the safety rope hook 121 in an embodiment. The hook is provided with a wire (not shown in the figure) inside, and the hook is enclosed by the wire and the buckle type hook to form a hook ring. A power supply can be provided on each of the surrounding-rod belt hook 111 or the safety rope hook 121, or a power supply can be provided in the safety belt (the wires and the power supply are not shown in the figure, i.e. the specific installation position is not limited). When the power supply is activated, the magnetically conductive material on the surface of the hook forms a closed magnetic loop, which forms an alternating magnetic field in the closed loop. Take FIG. 5 as an example, when the hook is in the empty ring state, the strength of the magnetic field is set as the reference value A1 at this time when the surrounding-rod belt hook 111 doesn't suspend the fixture 20, and the strength of the magnetic field is set as the reference value A2 when the safety rope hook 121 doesn't suspend the fixture 20, that is, the reference value A1 and the reference value A2 correspond to the first surrounding-rod belt hook magnetic field information, and the first safety rope hook magnetic field information, respectively.

Similarly, the closed magnetic loop is formed by the magnetically conductive material in the waist D-ring 131 of the safety belt, when the surrounding-rod belt hook 111 is buckled with the waist D-ring 131, the interference of the two magnetic loops causes the strength of the magnetic field of the surrounding-rod belt hook 111 to change abruptly, and the surrounding-rod belt hook magnetic field information obtained at this time is noted as the second surrounding-rod belt hook magnetic field information, and the strength of the magnetic field of the surrounding-rod belt hook 111 at this time and this state is noted as B1. Similarly, for the safety rope hook 121, the safety rope hook magnetic field information obtained at this time is noted as the second safety rope hook magnetic field information, and the strength of the magnetic field of the safety rope hook 121 at this time and this state is represented as B2. For the hook being buckled to the waist D-ring 131, it can refer to FIG. 4, where the surrounding-rod belt hook 111 is buckled to the waist D-ring 131 as shown in the figure.

Figure 6:
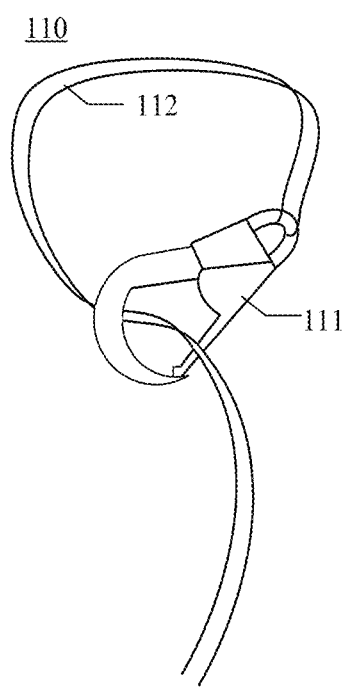
FIG. 6 is a schematic diagram of a surrounding-rod belt hook forming a buckled ring with the surrounding-rod belt body in an embodiment.
Figure 7:
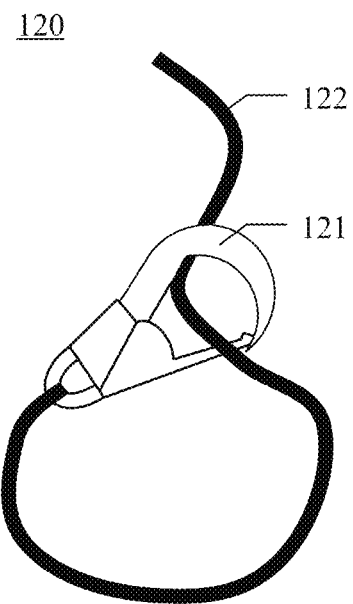
FIG. 7 is a schematic diagram of a safety rope hook forming a buckled ring with a safety rope body in an embodiment.

Further, in practice, there may also be a state in which the surrounding-rod belt hook 111 forms a buckled ring with the surrounding-rod belt body 112, as can be seen in FIG. 6, which is a schematic diagram of the surrounding-rod belt hook 111 forming a buckled ring with the surrounding-rod belt body 112 in one embodiment. Thus, in this case, the surrounding-rod belt hook 111 and the surrounding-rod belt body 112 also form a closed magnetic loop when buckled. Due to the magnetic loop, the strength of the magnetic field of the surrounding-rod belt hook 111 is changed abruptly, and the magnetic field information of the surrounding-rod belt hook 111 is obtained as the third surrounding-rod belt hook magnetic field information at this time, and the strength of the magnetic field is represented as C1 at this time. Similarly, it can refer to FIG. 7, which is a schematic diagram of the safety rope hook 121 and the safety rope body 120 to form a buckled ring in an embodiment. The safety rope body 120 and the safety rope hook 121 are coated with high magnetic permeability material, when the safety rope hook 121 and is buckled with the safety rope body 120, they form a closed magnetic loop. Due to the magnetic loop, the strength of the magnetic field of the safety rope hook 121 changes abruptly, the strength of the magnetic field of the safety rope hook 121 at this state is noted as C2, to obtain the magnetic field information of the safety rope hook 121 at this time as the third safety rope hook magnetic field information.

Figure 8:
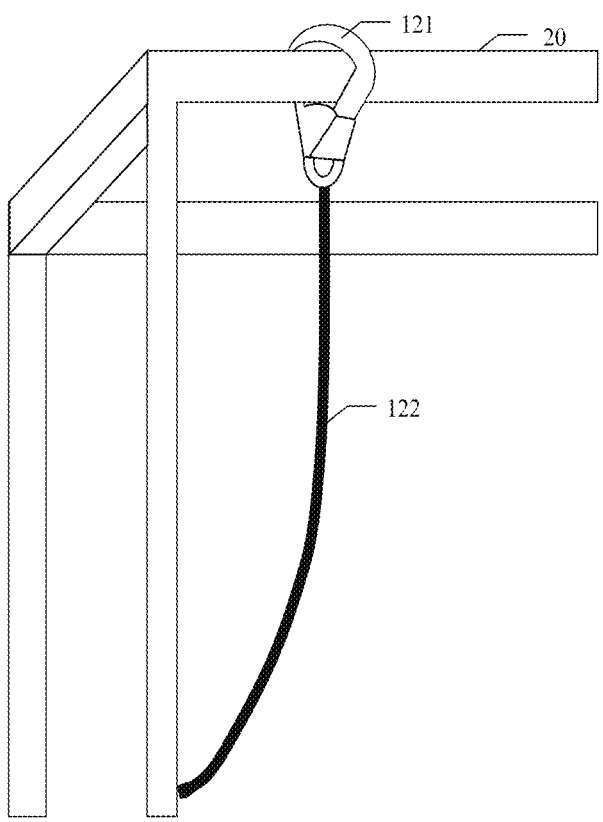
FIG. 8 is a schematic diagram of a safety rope hook suspending the fixture in an embodiment.

Further, when working at height, the safety belt hook suspends the fixture 20, or the surrounding-rod belt 110/safety rope 120 surrounds the fixture 20, which is usually a metal structure, and causes a change in the magnetic field. Therefore, when the surrounding-rod belt hook 111 suspends the fixture 20 (e.g., thin fence, thick fence, cross stretcher, fixing bar, etc.), the magnetic field information is the fourth surrounding-rod belt hook magnetic field information, and the strength of the magnetic field of the surrounding-rod belt hook 111 is noted as D1. When the safety rope hook 121 suspends the fixture 20 (e.g., thin fence, thick fence, cross stretcher, fixing bar, etc.), the safety rope hook magnetic field information is the fourth safety rope hook magnetic field information, and the strength of the magnetic field of the safety rope hook 121 is noted as D2. For the hook hanging the fixture 20, it can refer to FIG. 8, which is a schematic diagram of the safety rope hook 121 hanging the fixture 20 in one embodiment. Since the surrounding-rod belt hook 111 and the safety rope hook 121 have the similar structures, thus that the surrounding-rod belt hook 111 is buckled to the fixture 20 can refer to FIG. 8, and the specifics will not be further described. As can be seen from the above description, by coating the surface of the safety belt with a magnetically conductive material, the magnetic field information of each component can be detected in time to further determine the fixed state of the safety belt.

Step S120: querying a preset fixed state mapping table based on the magnetic field information of the safety belt body to obtain a fixed state of the safety belt, the fixed state mapping table is configured to save a mapping relationship between the magnetic field information and the fixed state.

In an embodiment, after determining the magnetic field information of each component of the safety belt body A100, the fixed state of the safety belt can be determined from the magnetic field information. Further, for the process of determining the fixed state, it may include, but is not limited to, substituting each value in the magnetic field information into the computational model, and determining the fixed state through the output values obtained by the computational model. The fixed state may be obtained, in a preferred embodiment, by querying the fixed state mapping table based on the magnetic field information. In addition, it can be understood that each component usually needs to be fixed to a certain fixture during operation, and taking an implementation scenario of electric power maintenance as an example, the fixture is usually a metal product, which results in that the magnetic field information in the fixed state is different from that in the unfixed state, i.e., the magnetic field information can be compared with the magnetic field information of the preset unfixed state in order to determine the fixed state of the safety belt. The specific determination process is not specifically limited, and what is exemplified in the embodiments of the present application is a preferred embodiment and is not a limitation of the technical solution.

In one embodiment, at step S120: the querying the preset fixed state mapping table based on the magnetic field information of the safety belt to obtain the fixed state of the safety belt includes:

when the magnetic field information of the safety belt is any one of the first surrounding-rod ring magnetic field information, the first surrounding-rod belt hook magnetic field information, the second surrounding-rod belt hook magnetic field information, the first safety rope hook magnetic field information, and the second safety rope hook magnetic field information, determining the safety belt to be in the unfixed state based on the fixed state mapping table;

when the magnetic field information of the safety belt is any one of the second surrounding-rod ring magnetic field information, the third surrounding-rod belt hook magnetic field information, the fourth surrounding-rod belt hook magnetic field information, the third safety rope hook magnetic field information, and the fourth safety rope hook magnetic field information, determining the safety belt to be in the fixed state based on the fixed state mapping table.

In one embodiment, it is clear that the magnetic field information of any component of the safety belt, in particular the component connected to the fixed position, is significantly different in the fixed state and in the unfixed state. Thus, in general the magnetic field information is associated with the fixed state of the safety belt, and the mapping relationship of this association is stored in the fixed state mapping. Thus, the fixed state of the safety belt can be determined from the mapping relationship between the magnetic field information and the fixed state. Further, since the magnetic field information of the surrounding-rod belt 110, the surrounding-rod belt hook 111, and the safety rope hook 121 is mainly monitored, i.e., their fixed states are determined based on their magnetic field information, and the fixed state of the safety belt is finally determined. Assuming that the change value of the strength of the magnetic field of the surrounding-rod belt hook 111 is monitored as A', the change value of the strength of the magnetic field of the safety rope hook 121 is monitored as B', and the change value of the strength of the magnetic field of the surrounding-rod ring is monitored as C', which correspond to the magnetic field information of the surrounding-rod belt hook, the magnetic field information of the safety rope hook, and the magnetic field information of the surrounding-rod ring, respectively. The specific mapping relationship between the magnetic field information and the fixed state may include when the magnetic field information is any one of the first surrounding-rod ring hook magnetic field information A1, the second surrounding-rod belt hook magnetic field information B1, the first surrounding-rod belt hook magnetic field information A2, the second safety rope hook magnetic field information B2, and the first surrounding-rod ring magnetic field information A3, the safety belt in the corresponding mapping relationship is in the unfixed state, that is, when any one of A'=A1, A'=B1, B'=A2, B'=B2, C'=A3 is satisfied, it is determined to be in the unfixed state; when the magnetic field information is any one of the third surrounding-rod belt hook magnetic field information C1, the fourth surrounding-rod belt hook magnetic field information D1, the third safety rope hook magnetic field information C2, and the fourth safety rope hook magnetic field information D2, and the second surrounding-rod belt hook magnetic field information D3, that is, any one of A'=C1, A'=D1, B'=C2, B'=D2, C'=D3 is satisfied, the safety belt in the corresponding mapping relationship is in the fixed state. And furthermore, taking the fixed state logic as 1 and the unfixed state logic as 0, when A'+B'+C'=0, it is determined that the safety belt is in the unfixed state; if it is not equal to 0, it is determined that the safety belt is in the fixed state. It is also worth noting that the mapping relationship between the magnetic field information stored in the fixed state mapping table and the fixed state may be a direct relationship, for example, in other embodiments the fixed state of the safety belt can be determined only based on a single component (in addition to the surrounding-rod belt 110, the surrounding-rod belt hook 111, and the safety rope hook 121 that have already been presented in the present application, and it may also include other components included in the safety belt), without a combination of multiple components, or the mapping relationship can be indirect relationship, such as as proposed in this embodiment, it requires multiple components to jointly determine the fixed state of the safety belt. In the indirect relationship, the fixed state can also be obtained by substituting the magnetic field information into the computational model corresponding to the mapping relationship. That is, the mapping relationships stored in the fixed state mapping table are various in reality, and only a preferred embodiment is proposed in the present application for illustration, which is not a limitation of the technology, and the mapping relationships therein are not limited to the above examples. Therefore, by means of this embodiment, the fixed state of the safety belt can be determined by querying the fixed state mapping table based on the magnetic field information, so that the fixed state of the safety belt can be determined timely and accurately, so as to make complete preparations for the subsequent matching of the prompting information based on the fixed state.

Step S130: outputting a warning signal based the fixed state.

In an embodiment, the warning signal includes one of an alarm signal and an alert signal; in the step S130, the outputting the warning signal based on the fixed state includes outputting the alarm signal when the safety belt is determined to be in the unfixed state; or outputting the alert signal when the safety belt is determined to be in the fixed state.

In one implementation, different warning signals can be output based on the fixed state of the safety belt. In this embodiment, it is mainly aimed at outputting the warning signal timely when the safety belt is actively detected to be in the unfixed state, so as to effectively remind the operator in various ways that the current safety belt is in the unfixed state, which carries a certain risk of an accident, and needs to be dealt timely to reduce the risk of an accident, so as to prevent the operator from falling down. Alternatively, when it is determined that the safety belt is in the fixed state, an alert signal is output to inform the user that the safety belt has been fixed and the user can operate safely. Further, it can be seen from the foregoing description that the safety belt is actively monitored mainly by the three components, so that in the safest case, all three components of the safety belt should be in the fixed state, thus a prompt suggestion signal can be output when the components are not in the fixed state, in order to suggest that the operator should bind the components completely, in order to maximize the safety of the operation. Differentiated warning signals are output for the fixed state and unfixed state of the safety belt, respectively, so that when the safety belt is fixed, the operator can know the state of the safety belt clearly in time, thereby reducing confusion, the redundant operation of self-checking, and enhancing the working efficiency of the operator; and the alarm signal is output in the unfixed state, such that the operator can know the present dangerous state in time, and actively inform the user proactively, such that the user can carry out remedial operations and so on, reducing the risk of accidents, and ensuring the operational safety of the operator.

In an implementation, at step S130: the outputting the warning signal includes: outputting a first warning instruction to an acoustic and optical alarm unit for outputting an acoustic and optical alarm based on the first warning instruction; and sending a second warning instruction to a remote communication unit for controlling the remote communication unit to output monitoring warning information to a remote backend based on the second warning instruction.

In an embodiment, in the previous embodiment, different signals are output based on the fixed state of the safety belt. In this embodiment, different signals can also be output based on the subject of the output signals. For example, the first warning instruction may be output to the acoustic and optical alarm unit, and the acoustic and optical alarm unit outputs an acoustic and optical alarm based on the first warning instruction, thereby informing the operator of the current operating state of the safety belt timely in the local area, the specific form of the output of the acoustic and optical alarm may include, but is not limited to, a buzzer, an LED light, a horn, a display device with a sound, etc., without any specific limitation. In addition, the remote communication unit (Wi-Fi module, 4G mobile communication module, 5G mobile communication module, etc.) may also be controlled to output monitoring warning information to the remote backend based on the second warning instruction, thereby enabling the remote inspector to synchronously monitor the fixation information of the safety belt of the operator. For example, when the safety belt of the operator is in the unfixed state for a long time, the inspector prompts to inform the operator to make the safety belt to be the fixed state timely, so as to ensure the safety of the operation. The acoustic and optical alarm unit outputs the warning signal to the local operator for acoustic and optical alarm, such that the local operator can independently understand the current risk, and operate to avoid the risk of accidents, or acoustic and optical alarm unit can simultaneously output monitoring warning information to the remote monitoring personnel, other people's monitoring makes the remote monitoring personnel synchronously understand the safety of the work of the operator, in this way to further improve the safety of the operator. The active intelligent detection technology automatically monitors and determines whether the safety belt of the operator has been fixed and whether there is a danger of high fall, and warns the operator in time to avoid the operator losing protection and falling down.

Therefore, the present application can determine, on the basis of not changing the mechanical structure and safety performance of the existing safety belt, the fixed state information of the safety belt through the magnetic field information of the safety belt, and provide a warning timely when the safety belt is in the unfixed state, so as to improve the operational safety of the operator.

Figure 9:
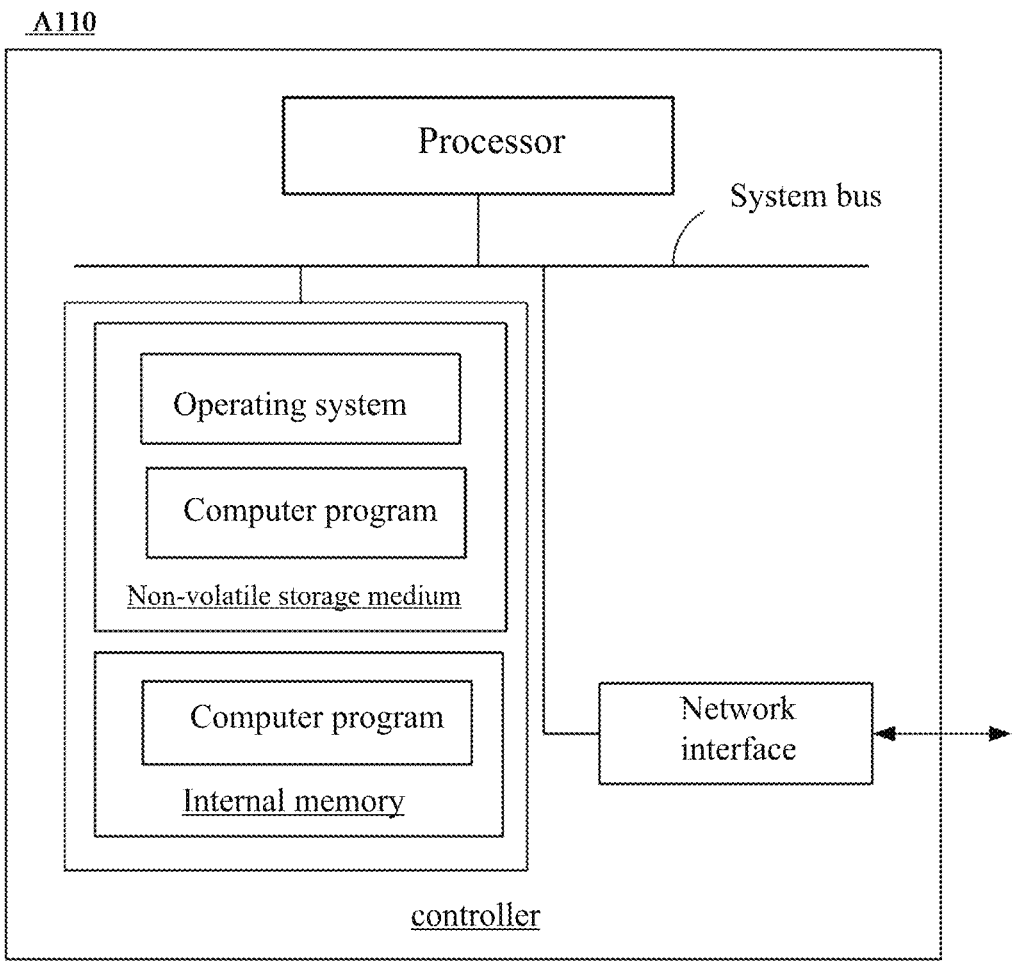
FIG. 9 is a block diagram of the internal structure of a controller in an embodiment.

FIG. 9 is a block diagram of the internal structure of a controller in one embodiment. As shown in FIG. 9, the controller A110 includes a processor, a memory, and a network interface connected via a system bus. The memory includes a non-volatile storage medium and an internal memory. The non-volatile storage medium of the controller A110 stores an operating system and may also store a computer program which, when executed by the processor, causes the processor to implement the method for preventing a fall of an operator. The internal memory may also store a computer program that, when executed by the processor, causes the processor to implement the method for preventing a fall of an operator. It will be appreciated by those skilled in the art that the structure illustrated in FIG. 9 is only a block diagram of part of the structure relevant to the embodiment of the present application, and does not constitute a limitation on the controller A110 to which the present application embodiment is applied, and that the specific controller A110 may include more or fewer components than those shown in the figure, or combine certain components, or have a different arrangement of components.

Figure 10:
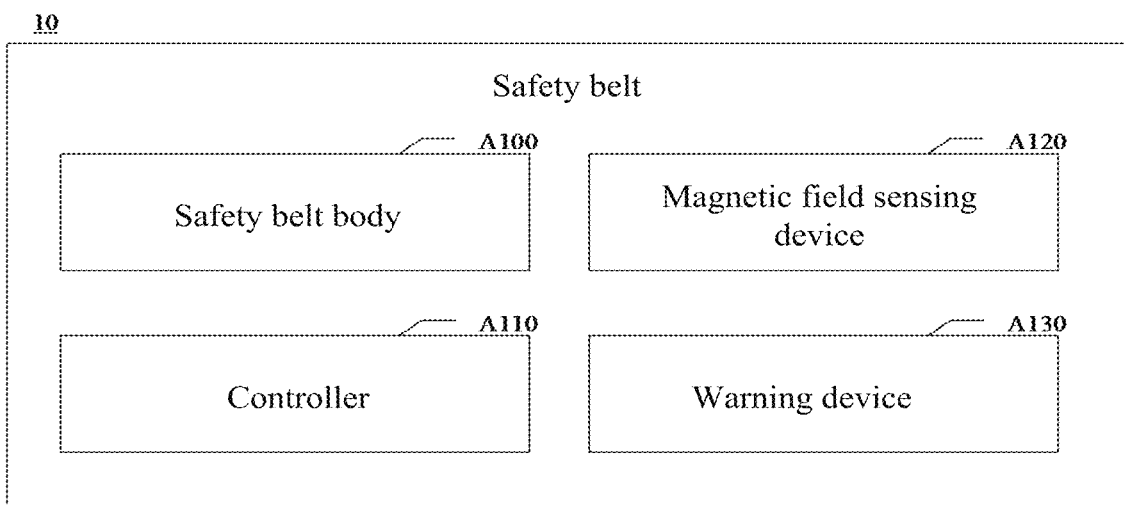
FIG. 10 is a block diagram of the structure of a safety belt in an embodiment.
Figure 11:
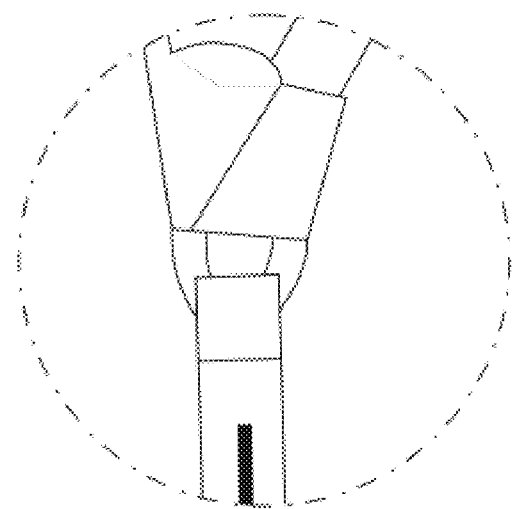
FIG. 11 is a schematic diagram of connection of a surrounding-rod belt body and a surrounding-rod belt hook in an embodiment.
Figure 12:
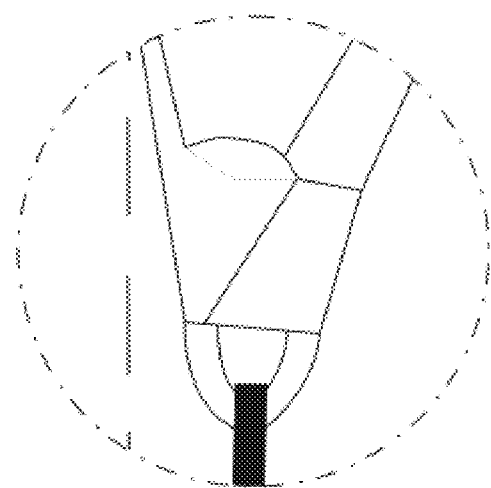
FIG. 12 is a schematic diagram of connection of a safety rope hook and a safety rope body in an embodiment.
Figure 13:
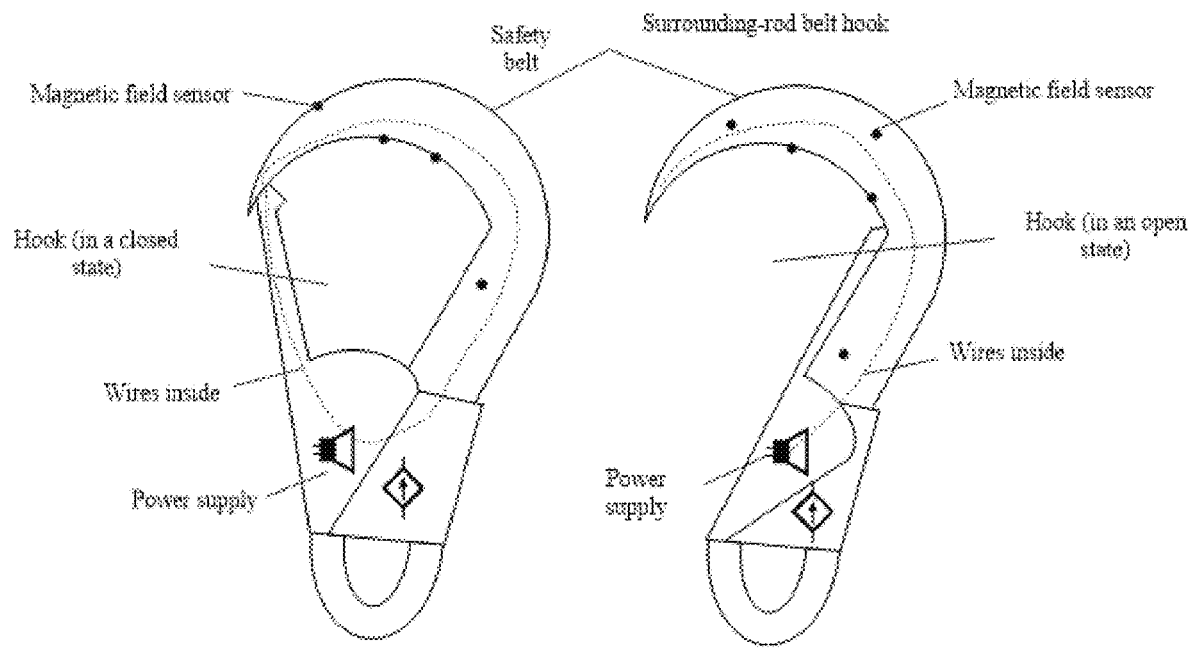
FIG. 13 is a schematic diagram of connection of a surrounding-rod belt body and a surrounding-rod belt hook in an embodiment.
Figure 14:
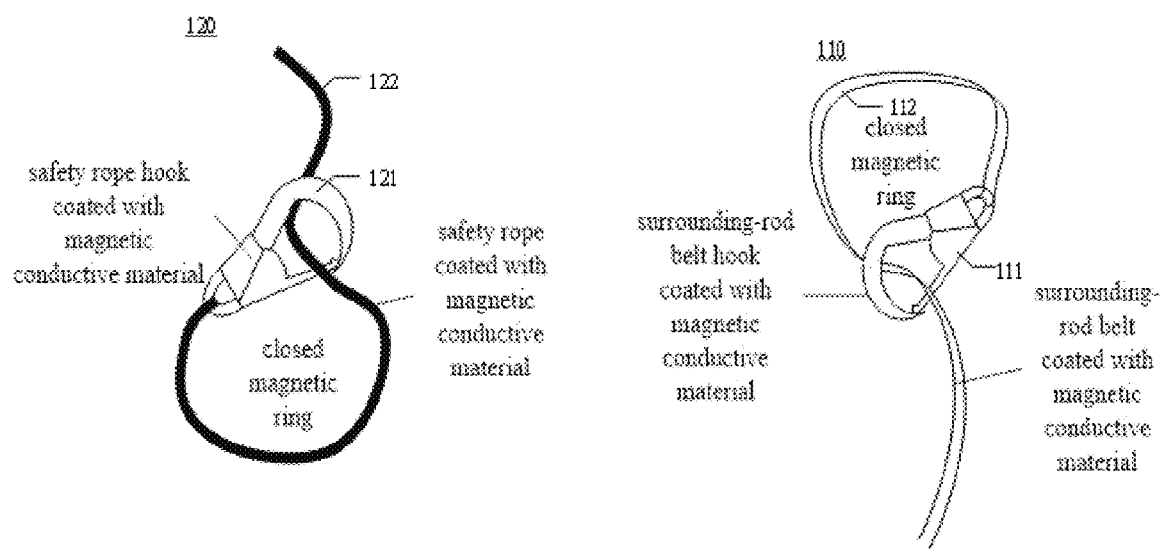
FIG. 14 is a schematic diagram of connection of a safety rope hook and a safety rope body in an embodiment.

FIG. 10 is a block diagram of the structure of the safety belt in one embodiment. As shown in FIG. 10, the safety belt 10 includes a safety belt body A100, a controller A110, a magnetic field sensing device A120, and an early warning device A130.

In one embodiment, the safety belt body A100 includes a waist belt 130, a surrounding-rod belt 110, and a safety rope 120, and specifically for the structural schematic diagram of the safety belt body A100, it can refer to FIG. 2 and the foregoing description; similarly, for the controller A110, it can refer to FIG. 9 and the foregoing description, which will not be repeated herein. The magnetic field sensing device A120 is configured to detect and send the magnetic field information of the safety belt body A100 to the controller A110. The early warning device A130 is configured to respond to a control of the controller A110 to output a warning signal. Based on the detection needs, different numbers and types of the magnetic field sensing device A120 or the warning device A130 can be provided at different locations. Further, the specific number, types, and the specific location of the installation in the safety belt 10 of the magnetic field sensing device A120 or the warning device A130 are not limited, and the above differences do not constitute a limitation on the technical solution of the present application.

In one embodiment, the surrounding-rod belt 110 includes a surrounding-rod belt hook 111 and a surrounding-rod belt body 112, and the safety rope 120 includes a safety rope hook 121 and a safety rope body 122; the surrounding-rod belt body 112 includes a power supply and a wire, and when the surrounding-rod belt body 112, the surrounding-rod belt hook 111, and the safety rope hook 121 are powered by the power supply, the surrounding-rod belt body 112, the surrounding-rod belt hook 111, and the safety rope hook 121 form a closed loop through the wire; the surface of the belt body 112 is coated with a magnetically conductive material, so that when the surrounding-rod belt hook 111 is buckled to the surrounding-rod belt 110, and the safety rope hook 121 is buckled to the safety rope body 122, the surrounding-rod belt 110, the surrounding-rod belt hook 111, and the safety rope hook 121 form a closed magnetic loop through the magnetically conductive material; and the closed loop and the closed magnetic loop form an alternating magnetic field, to be detachable by the magnetic field sensing device A120.

In one embodiment, it should be noted that the safety belt 10 in the present application is not a completely new safety belt, such as the mentioned controller A110, the magnetic field sensing device A120, the warning device A130, the wires, the power supply, and the magnetically conductive material coated on the surface of each of the devices of the safety belt 10 are more akin to the additional devices of the safety belt 10. The above-described additional devices added to the existing safety belt can be understood as kits, which can be attached to the existing safety belt by means including, but not limited to, being pasted, sewn, wound, etc., so as to realize the method for preventing a fall of an operator as proposed in one embodiment of the present application without changing the structure of the existing safety belt. Because the structure of the existing safety belt is not changed, thus only the corresponding additional devices need to be produced, and provided on the safety belt by any connection method, the method of preventing the fall of the operator as proposed in one embodiment of the present application can be realized, i.e., the cost of fitting is reduced, and it is easier to be applied to a larger number of existing safety belts, such that the present method is easier to be promoted, and has a broader commercial prospect.

In an embodiment, the early warning device A130 includes: an acoustic and optical alarm unit, configured for responding to a first warning instruction received from the controller A110 to output an acoustic and optical alarm signal; and a remote communication unit, configured for responding to a second warning instruction received from the controller A110 to output monitoring warning information to a remote backend. The specific form of output of the acoustic and optical alarm may include, but is not limited to, a buzzer, an LED light, a horn, a display device with sound, etc., without specific limitation.

In one embodiment, a computer-readable storage medium storing a computer program is proposed, the computer program, when executed by a processor, cause the processor to perform the method of preventing the fall of the operator as described in the present application.

Those skilled in the art may appreciate that achieving all or part of the processes in the methods of the above embodiments is possible by means of a computer program to instruct the relevant hardware to do so, the program is storable in a non-volatile computer-readable storage medium, the program, when executed, may include processes of the embodiments of each method described above. Any reference to a memory, storage, database, or other medium used in the embodiments provided in the present application may include non-volatile and/or volatile memory. The non-volatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external cache memory. By way of illustration and not limitation, RAM is available in a variety of forms, such as a static RAM (SRAM), a dynamic RAM (DRAM), a synchronous DRAM (SDRAM), a dual data rate SDRAM (DDRSDRAM), an enhanced SDRAM (ESDRAM), a synchronous link (Synchlink) DRAM (SLDRAM), a memory bus (Rambus) direct RAM (RDRAM), a direct memory bus dynamic RAM (DRDRAM), and a memory bus dynamic RAM (RDRAM).

The technical features of the above-described embodiments can be combined in any way, and not all possible combinations of the technical features of the above-described embodiments have been described for the sake of simplicity of description; however, as long as there is no contradiction in the combinations of the technical features, they should be considered to be within the scope of the present specification.

The above-described embodiments express only several embodiments of the present application, which are described in a more specific and detailed manner, but are not to be construed as a limitation of the scope of the present application. It should be pointed out that, for those skilled in the art, a number of deformations and improvements can be made without departing from the conception of the present application, all of which fall within the scope of the present application. Therefore, the scope of the patent application shall be subject to the attached claims.

What is claimed is:

1. A method for preventing a fall of an operator, applied to a safety belt, wherein the safety belt comprises a safety belt body and a magnetic field sensing device, wherein the safety belt body comprises a waist belt, a waist D-ring, a surrounding-rod belt and a safety rope, wherein the surrounding-rod belt comprises a surrounding-rod belt hook and a surrounding-rod belt body, and the safety rope comprises a safety rope hook and a safety rope body;

the safety belt body comprises a power supply and a wire, and when the surrounding-rod belt body, the surrounding-rod belt hook and the safety rope hook are powered by the power supply, the surrounding-rod belt body, the surrounding-rod belt hook and the safety rope hook form a closed circuit through the wire;

surfaces of the waist belt, the waist D-ring, the surrounding-rod belt and the safety rope, and surfaces of surrounding-rod belt hook and the surrounding-rod belt body, and surfaces of the safety rope hook and the safety rope body all are coated with magnetically conductive materials;

when the surrounding-rod belt body passes through the surrounding-rod belt hook, and the safety rope body passes through the safety rope hook, the surrounding-rod belt body, the surrounding-rod belt hook and the safety rope hook, the safety rope body form a closed magnetic loop through the magnetically conductive material; the closed loop and the closed magnetic loop form an alternating magnetic field sensed by the magnetic field sensing device;

wherein the method comprises:

obtaining, by the magnetic field sensing device, magnetic field information of the safety belt body worn by the operator;

querying a preset fixed state mapping table based on the magnetic field information of the safety belt body to obtain a fixed state of the safety belt, wherein the preset fixed state mapping table is configured to save a mapping relationship between the magnetic field information of the safety belt and the fixed state; and outputting a warning signal based the fixed state;

wherein the magnetic field information of the safety belt body comprises a first surrounding-rod ring magnetic field information, a second surrounding-rod ring magnetic field information, a first surrounding-rod belt hook magnetic field information, a second surrounding-rod belt hook magnetic field information, a third surrounding-rod belt hook magnetic field information, a fourth surrounding-rod belt hook magnetic field information, a first safety rope hook magnetic field information, a second safety rope hook magnetic field information, a third safety rope hook magnetic field information, and a fourth safety rope hook magnetic field information;

the first surrounding-rod ring magnetic field information is magnetic field information when the surrounding-rod belt body is not wrapped around a fixture; the second the surrounding-rod ring magnetic field information is magnetic field information when the surrounding-rod belt body is wrapped around the fixture;

the first surrounding-rod belt hook magnetic field information is magnetic field information when the surrounding-rod belt hook is in an empty ring state; the second surrounding-rod belt hook magnetic field information is magnetic field information when the surrounding-rod belt hook is buckled to the waist D-ring; the third surrounding-rod belt hook magnetic field information is magnetic field information when the surrounding-rod belt hook is buckled to the surrounding-rod belt body; the fourth surrounding-rod belt hook magnetic field information is magnetic field information when the surrounding-rod belt hook is suspended by the fixture; and the first safety rope hook magnetic field information is magnetic field information when the safety rope hook is in the empty ring state; the second safety rope hook magnetic field information is magnetic field information when the safety rope hook is buckled to the waist D-ring; the third safety rope hook magnetic field information is magnetic field information when the safety rope hook is buckled to the safety rope body; and the fourth safety rope hook magnetic field information is magnetic field information when the safety rope hook is suspended by the fixture.

2. The method for preventing the fall of the operator according to claim 1, wherein the querying the preset fixed state mapping table based on the magnetic field information of the safety belt body to obtain the fixed state of the safety belt comprises:

when the magnetic field information of the safety belt body is any one of the first surrounding-rod ring magnetic field information, the first surrounding-rod belt hook magnetic field information, the second surrounding-rod belt hook magnetic field information, the first safety rope hook magnetic field information, and the second safety rope hook magnetic field information, determining the safety belt to be in an unfixed state based on the fixed state mapping table;

when the magnetic field information of the safety belt body is any one of the second surrounding-rod ring magnetic field information, the third surrounding-rod belt hook magnetic field information, the fourth surrounding-rod belt hook magnetic field information, the third safety rope hook magnetic field information, and the fourth safety rope hook magnetic field information, determining the safety belt to be in the fixed state based on the fixed state mapping table.

3. The method for preventing the fall of the operator according to claim 2, wherein the warning signal comprises one of an alarm signal and an alert signal;

wherein the outputting the warning signal based on the fixed state comprises:

outputting the alarm signal when the safety belt is determined to be in the unfixed state; or outputting the alert signal when the safety belt is determined to be in the fixed state.

4. The method for preventing the fall of the operator according to claim 1, wherein the outputting the warning signal comprises:

outputting a first warning instruction to an acoustic and optical alarm unit for outputting an acoustic and optical alarm based on the first warning instruction; and sending a second warning instruction to a remote communication unit for controlling the remote communication unit to output monitoring warning information to a remote backend based on the second warning instruction.

5. A controller, comprising:

a processor and a memory;

wherein the processor is configured to execute a computer program stored in the memory to implement the method according to claim 1.

6. A safety belt, comprising:

a safety belt body, wherein the safety belt body comprises a waist belt, a surrounding-rod belt and a safety rope;

a controller as claimed in claim 5;

a magnetic field sensing device, configured for detecting and sending magnetic field information of the safety belt body to the controller; and an early warning device, configured for responding to a control of the controller to output a warning signal.

7. The safety belt according to claim 6, wherein the early warning device comprises:

an acoustic and optical alarm unit, configured for responding to a first warning instruction received from the controller to output an acoustic and optical alarm signal; and a remote communication unit, configured for responding to a second warning instruction received from the controller to output monitoring warning information to a remote backend.

8. A non-transitory computer-readable storage medium, on which a computer program is stored, wherein the computer program when executed by a processor implements the method according to claim 1.

* * * * *